United States Patent
Cloke

(10) Patent No.: US 6,710,951 B1
(45) Date of Patent: Mar. 23, 2004

(54) PHASE LOCKED LOOP EMPLOYING A FRACTIONAL FREQUENCY SYNTHESIZER AS A VARIABLE OSCILLATOR

(75) Inventor: Robert L. Cloke, Santa Clara, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 350 days.

(21) Appl. No.: 09/999,888

(22) Filed: Oct. 31, 2001

(51) Int. Cl.[7] .............................................. G11B 20/06
(52) U.S. Cl. ....................................................... 360/29
(58) Field of Search ............................. 360/75, 53, 29, 360/26, 42, 48, 77.08

(56) References Cited

U.S. PATENT DOCUMENTS

| | | | |
|---|---|---|---|
| 4,686,488 A | | 8/1987 | Attenborough |
| 4,994,768 A | | 2/1991 | Shepherd et al. |
| 5,021,754 A | | 6/1991 | Shepherd et al. |
| 5,055,800 A | | 10/1991 | Black et al. |
| 5,070,310 A | * | 12/1991 | Hietala et al. ............... 331/1 A |
| 5,093,632 A | * | 3/1992 | Hietala et al. ............... 331/1 A |
| 5,166,642 A | * | 11/1992 | Hietala ........................ 331/1 A |
| 5,332,930 A | * | 7/1994 | Volk ............................ 327/156 |
| 5,384,502 A | * | 1/1995 | Volk ............................ 327/157 |
| 5,781,044 A | | 7/1998 | Riley et al. |
| 6,044,124 A | | 3/2000 | Monahan et al. |
| 6,047,029 A | | 4/2000 | Eriksson et al. |
| 6,094,100 A | | 7/2000 | Kamikubo et al. |
| 6,141,170 A | * | 10/2000 | Hatae et al. ................. 360/72.1 |
| 6,204,991 B1 | * | 3/2001 | Karube ....................... 360/78.04 |
| 6,236,275 B1 | | 5/2001 | Dent |
| 6,236,703 B1 | | 5/2001 | Riley |
| 6,469,849 B1 | * | 10/2002 | Ellis et al. ..................... 360/29 |
| 6,490,111 B1 | * | 12/2002 | Sacks ........................... 360/53 |

OTHER PUBLICATIONS

Curtis Barrett, "Fractional/Integer-N PLL Basics", Texas Instruments Technical Brief SWRA029, http://www.ti.com/sc/docs/psheets/abstract/apps/swra029.htm.

* cited by examiner

Primary Examiner—David Hudspeth
Assistant Examiner—Fred F. Tzeng
(74) Attorney, Agent, or Firm—Milad G. Shara, Esq.; Howard H. Sheerin, Esq.

(57) ABSTRACT

A phase locked loop (PLL) circuit is disclosed comprising a phase detector for generating a phase error between an input oscillating signal and an output oscillating signal. A fractional frequency synthesizer (FFS) generates the output oscillating signal in response to the phase error, wherein the FFS comprises an input for receiving a reference oscillating signal, and a fractional divider responsive to variables I and Fr. The variable I is an integer value, and the variable Fr is a fractional value, both of which are generated in response to the phase error.

31 Claims, 6 Drawing Sheets

PHASE LOCKED LOOP EMPLOYING A FRACTIONAL FREQUENCY SYNTHESIZER AS A VARIABLE OSCILLATOR

BACKGROUND OF THE INVENTION

1. Field of the Invention

The present invention relates to phase locked loop circuits. More particularly, the present invention relates to a phase locked loop employing a fractional frequency synthesizer as a variable oscillator.

2. Description of the Prior Art

Various communication systems may propagate a clock signal, for example, when cascading a series of signal repeaters or when self-servo writing a disk drive. The clock signal may be propagated numerous times using similar or identical timing recovery circuits. In the case of the cascaded signal repeaters, the timing recovery circuits may be physically distinct, such as every few miles. In the case of self-servo writing a disk drive, a single timing recovery circuit is used to repetitively propagate a write clock from a previously written track to a subsequently written track tens of thousands of times. Any imperfection in replicating the clock signal will grow exponentially due to cascading a large number of multiplicative effects.

A conventional timing recovery circuit typically comprises a phase locked loop (PLL) 2 as shown in FIG. 1. The PLL 2 comprises a voltage controlled oscillator (VCO) 4 for outputting a propagated clock signal 6 by frequency/phase locking to an input clock signal 8. A phase detector 10 detects a phase error 12 between the output signal 6 and the input signal 8. A loop filter 14 filters the phase error 12 to generate a control signal 16 applied to the VCO 4. The loop filter 14 determines the type and order of the closed loop system.

A low order PLL (such as a Type 0, or uncompensated type I) will not properly reject static errors in the VCO 4 and therefore are not suitable for propagating a clock signal. A higher order PLL (such as a compensated type I or Type II and higher) will exhibit overshoot ($|G|>1$) in at least part of the closed-loop frequency response which can cause uncontrolled systematic error growth in propagating a clock signal. Although various techniques have been suggested to address these drawbacks, further improvements are desirable.

SUMMARY OF THE INVENTION

The present invention may be regarded as a phase locked loop (PLL) circuit comprising an input for receiving an input oscillating signal, and an output for outputting an output oscillating signal. A first phase detector generates a first phase error between the input oscillating signal and the output oscillating signal. A fractional frequency synthesizer (FFS) generates the output oscillating signal in response to the first phase error, the FFS comprising an input for receiving a reference oscillating signal, and a fractional divider responsive to variables I and Fr. The variable I is an integer value, and the variable Fr is a fractional value, both of which are generated in response to the first phase error.

In one embodiment the FFS further comprises a first integer divider for integer dividing a frequency of the reference oscillating signal by an integer X1 to generate an integer divided oscillating signal, and a second integer divider for integer dividing a frequency of the output oscillating signal by at least two integers, including integer X2 selected during a first time interval and an integer X3 selected during a second time interval, to effectively divide the output oscillating signal by the value (I+Fr) to generate a fractionally divided oscillating signal. The FFS further comprises a second phase detector for generating a second phase error between the integer divided oscillating signal and the fractionally divided oscillating signal, and a variable oscillator, responsive to the second phase error, for generating the output oscillating signal.

In one embodiment, the FFS further comprises a loop filter for filtering the second phase error to generate a control signal applied to the variable oscillator.

In one embodiment, X3=X2+1. In an alternative embodiment, the FFS further comprises a dither function modulator responsive to Fr for generating a switching sequence. The switching sequence selects between at least the X2 and X3 integers as the denominator for the second integer divider. In one embodiment, the dither function modulator comprises a sigma-delta dither function.

In another embodiment, the FFS further comprises a compensator for attenuating a periodic error in the second phase error to generate a compensated phase error. In one embodiment, the FFS further comprises a loop filter for filtering the compensated phase error to generate a control signal applied to the variable oscillator.

In yet another embodiment, the PLL circuit further comprises an amplifier for amplifying the first phase error by a gain.

The present invention may also be regarded as a method of frequency locking an output oscillating signal to an input oscillating signal. A first phase error is generated between the input oscillating signal and the output oscillating signal. Variables I and Fr are generated in response to the first phase error, where I is an integer value and Fr is a fractional value. A frequency of a selected oscillating signal is divided by (I+Fr).

The present invention may also be regarded as a self-servo writing disk drive comprising a disk having a plurality of concentric tracks, and a head connected to a distal end of an actuator arm. The head for servo-writing a plurality of the tracks by writing embedded servo sectors at a predetermined interval around the circumference of the disk. The head also for reading a first write clock from a previously servo-written track, the first write clock for writing the embedded servo sectors and a second write clock to a subsequent track. The disk drive further comprises a preamp circuit for generating a write signal applied to the head for writing the embedded servo sectors and the second write clock to the subsequent track, and a phase locked loop (PLL) for generating a clock signal for use in writing the embedded servo sectors and the second write clock to the subsequent track. The PLL comprises an input for receiving an input oscillating signal representing the first write clock, an output for outputting an output oscillating signal used to generate the clock signal, a first phase detector for generating a first phase error between the input oscillating signal and the output oscillating signal, and a fractional frequency synthesizer (FFS) for generating the output oscillating signal in response to the first phase error. The FFS comprises an input for receiving a reference oscillating signal, and a fractional divider responsive to variables I and Fr, wherein I is an integer, Fr is a fractional value, and the variables I and Fr are generated in response to the first phase error.

DESCRIPTION OF THE PREFERRED EMBODIMENTS

Figure 1:
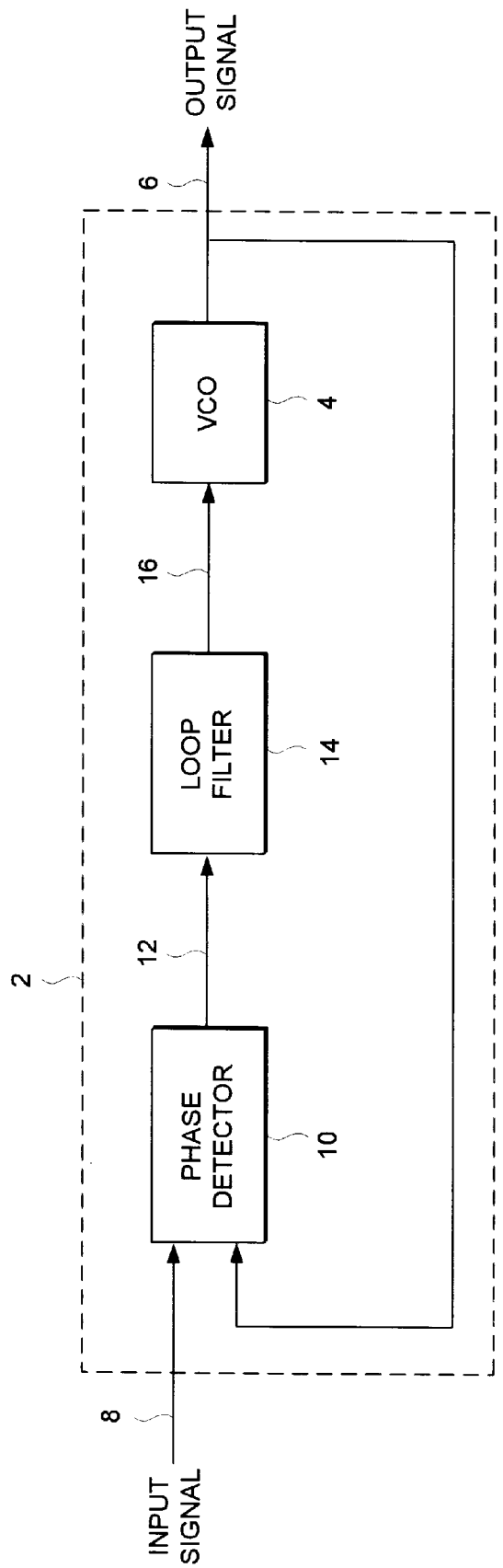
FIG. 1 shows a prior art phase locked loop (PLL) comprising a variable controlled oscillator for generating the output oscillating signal in response to a phase error between the output oscillating signal and the input oscillating signal.
Figure 2:
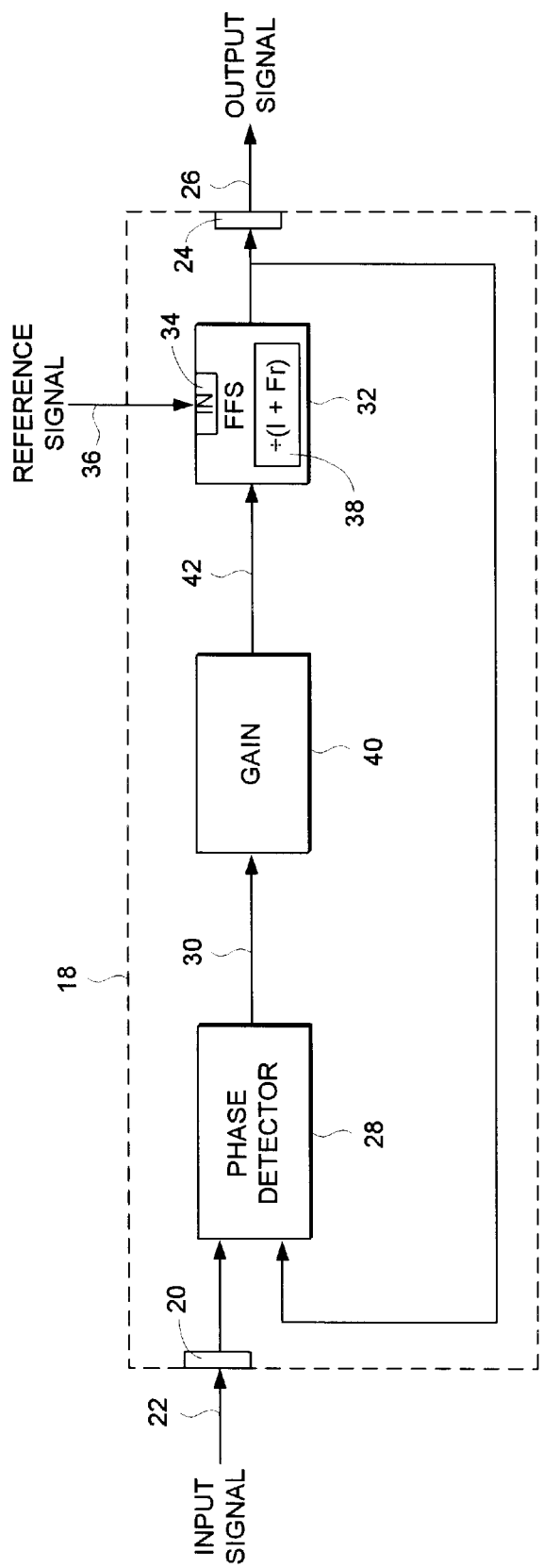
FIG. 2 shows a PLL circuit according to an embodiment of the present invention wherein a fractional frequency synthesizer (FFS) is used as the variable oscillator for generating the output oscillating signal.

FIG. 2 shows a phase locked loop (PLL) circuit 18 according to an embodiment of the present invention. The PLL circuit 18 comprises an input 20 for receiving an input oscillating signal 22, and an output 24 for outputting an output oscillating signal 26. A first phase detector 28 generates a first phase error 30 between the input oscillating signal 22 and the output oscillating signal 26. A fractional frequency synthesizer (FFS) 32 generates the output oscillating signal 26 in response to the first phase error 30, the FFS 32 comprising an input 34 for receiving a reference oscillating signal 36, and a fractional divider 38 responsive to variables I and Fr. The variable I is an integer value, and the variable Fr is a fractional value, both of which are generated in response to the first phase error 30.

In the embodiment of FIG. 2, the PLL circuit 18 further comprises an amplifier 40 for amplifying the first phase error 30 by a gain to generate an amplified phase error 42 applied to the FFS 32. The variables I and Fr are generated in response to the amplified phase error 42. The gain of the amplifier 40 is selected to achieve the desired closed-loop operating characteristics (e.g., tracking bandwidth), and in one embodiment, the gain is programmably tuned to an optimal operating value. In one embodiment, the gain is selected so that the bandwidth of the outer loop is significantly less than the bandwidth of the FFS 32 to ensure the closed loop response of the outer loop has no frequency domain overshoot (i.e. the magnitude of the closed loop gain does not exceed unity at any frequency ). This constraint on frequency domain overshoot prevents propagation of systematic errors.

Figure 3:
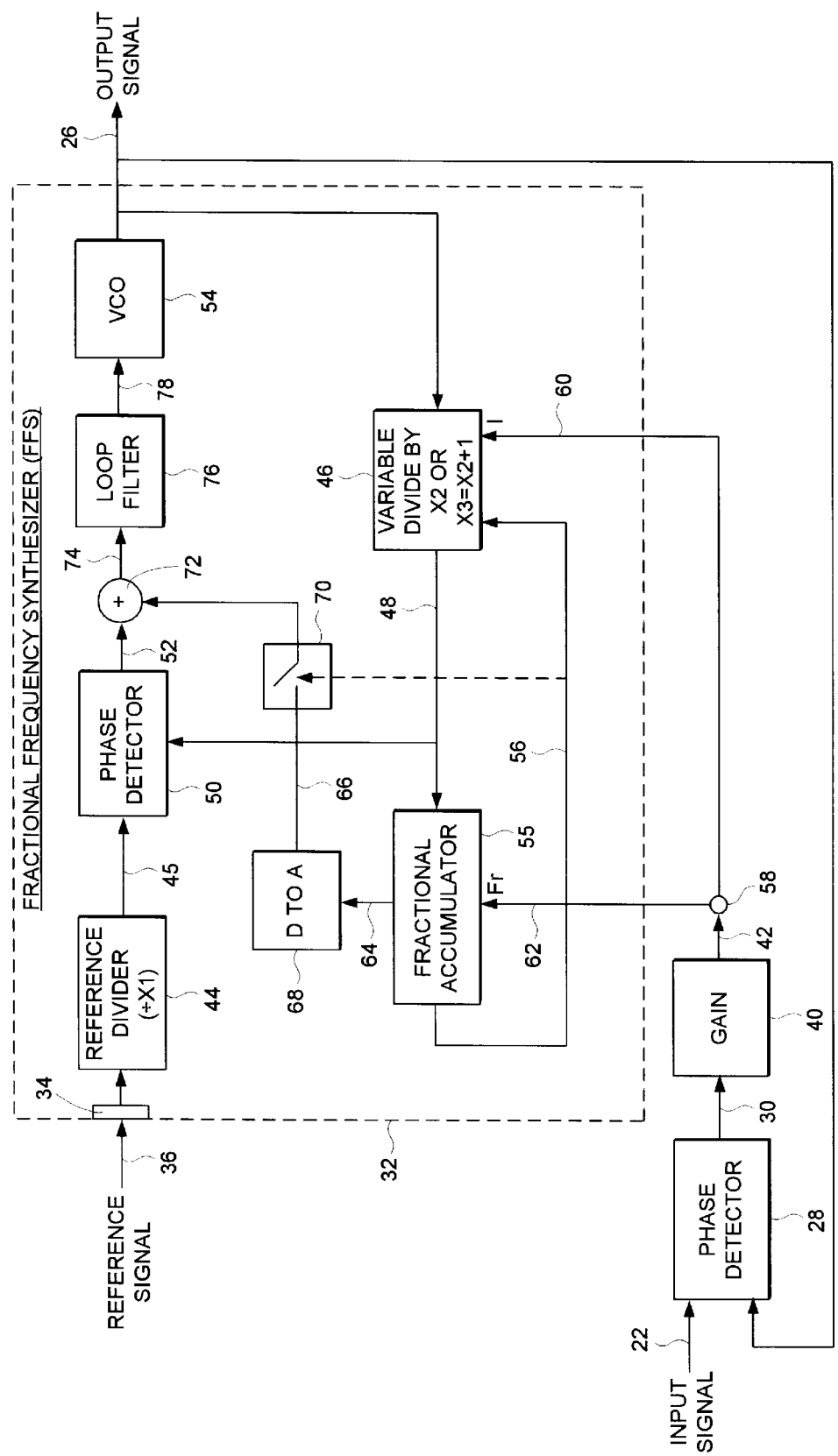
FIG. 3 shows a PLL circuit according to an embodiment of the present invention, and in particular, further details of a suitable FFS comprising an X2 or X3 integer divider.

FIG. 3 shows further details of a PLL circuit according to an embodiment of the present invention, including a suitable FFS 32. The FFS 32 comprises a first integer divider 44 for integer dividing a frequency of the reference oscillating signal 36 by an integer X1 to generate an integer divided oscillating signal 45, and a second integer divider 46 for integer dividing a frequency of the output oscillating signal 26 by at least two integers, including integer X2 selected during a first time interval and an integer X3 selected during a second time interval, to effectively divide the output oscillating signal 26 by the value (I+Fr) to generate a fractionally divided oscillating signal 48. The FFS 32 further comprises a second phase detector 50 for generating a second phase error 52 between the integer divided oscillating signal 45 and the fractionally divided oscillating signal 48. A variable oscillator. 54, responsive to the second phase error 52, generates the output oscillating signal 26. In the embodiment of FIG. 3, the variable oscillator comprises a voltage controlled oscillator (VCO) 54.

In the embodiment of FIG. 3, X3=X2+1 and a fractional accumulator 55 generates a control signal 56 applied to the second integer divider 46 for selecting between X2 and X2+1. At junction 58 the variable I is generated from the integer part of the amplified phase error 42, wherein X2 is set to I in the second integer divider 46. The variable Fr 62 is generated at junction 58 from the fractional part of the amplified phase error 42. The variables I60 and Fr 62 may be generated as analog or digital signals. The fractional accumulator 55 is responsive to the variable Fr 62 to generate the control signal 56 for selecting between X2 and X2+1 at the appropriate time. The fractional accumulator 55 is a conventional component the details of which are omitted so as not to obscure the embodiment of the invention. Suitable fractional accumulators are disclosed in prior art references discussing fractional-N frequency synthesizers (FNFS).

In the embodiment of FIG. 3, switching between X2 and X2+1 as the denominator for the second integer divider 46 creates a periodic error in the second phase error 52. To compensate for this periodic error, the fractional accumulator 55 generates a digital compensation signal 64 converted to an analog compensation signal 66 by a digital-to-analog converter 68. A switch 70 controlled by control signal 56 applies the analog compensation signal 66 to subtractor 72 in order to subtract the analog compensation signal 66 from the second phase error 52 at the appropriate time, thereby generating a compensated phase error 74. In the embodiment of FIG. 3, the FFS 32 further comprises a loop filter 76 for filtering the compensated phase error 74 to generate a control signal 78 applied to the VCO 54.

Figure 4:
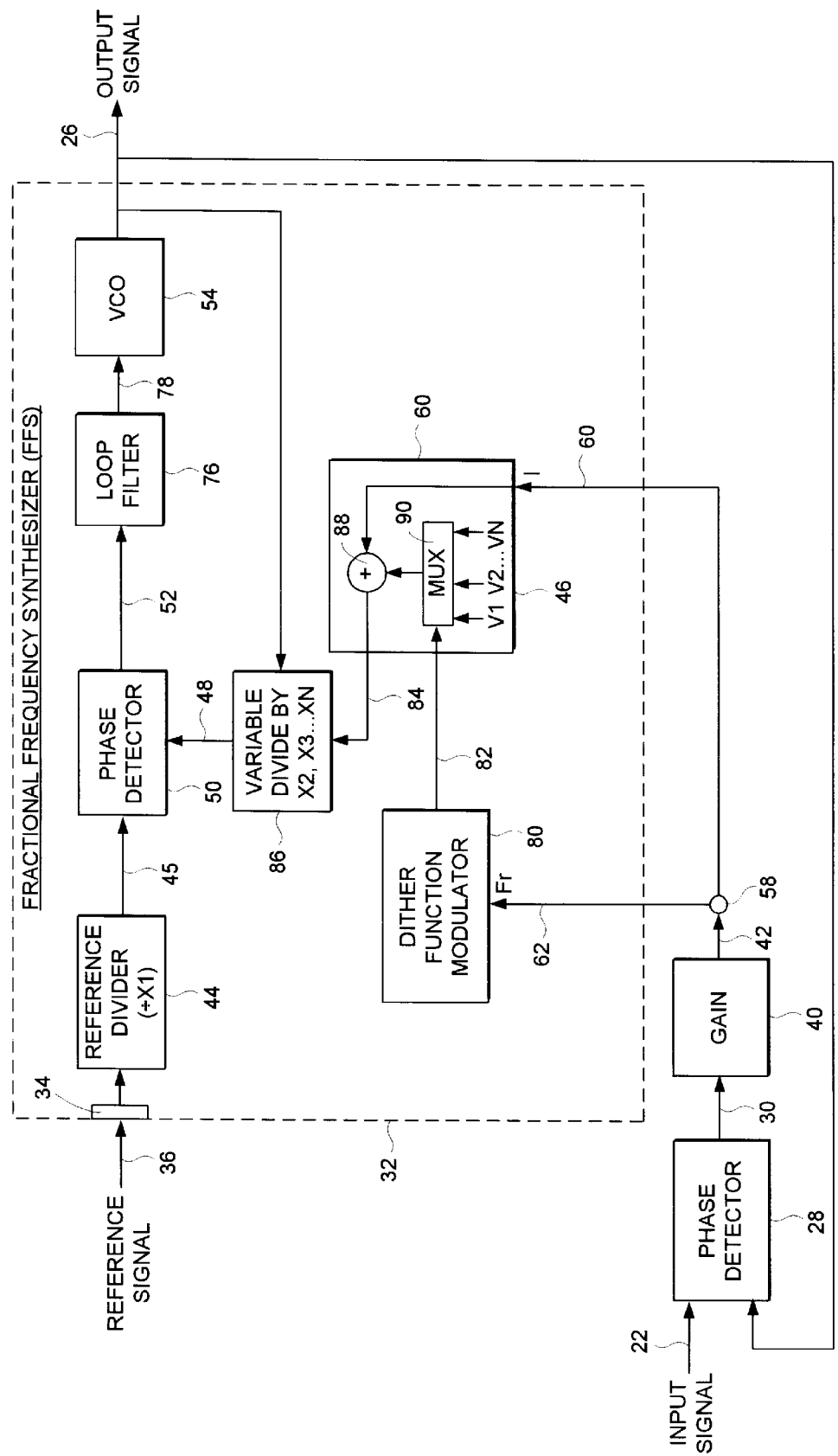
FIG. 4 shows a PLL circuit according to an embodiment of the present invention, and in particular, further details of a suitable FFS comprising a dither function modulator for selecting between a plurality of integers for use as the denominator of an integer divider.

Any suitable FFS 32 may be employed in the embodiments of the present invention. FIG. 4 shows an embodiment for an FFS 32 comprising a dither function modulator 80 responsive to variable Fr 62 for generating a switching sequence 82. The switching sequence 82 selects between two or more integer values X2, X3, . . . XN 84 as the denominator for the second integer divider 86. In the embodiment of FIG. 4, the integer values X2, X3, . . . XN 84 are generated by summing 88 variable I 60 with an integer value V1, V2, . . . VN as selected by the switching signal 82 via multiplexer 90. Dithering between a plurality of integers effectively compensates for the periodic phase error induced by the second integer divider 46 employed in the embodiment of FIG. 3 which uses a fractional accumulator 55 to select between X2 or X2+1 as the denominator. The dither function modulator 80 spreads the spectrum of the noise away from DC, and the loop filter 76 attenuates the high frequency content of the error signal, resulting in a highly effective system. In one embodiment, the dither function modulator 80 comprises a sigma-delta dither function. The dither function modulator 80 is a conventional component the details of which are omitted so as not to obscure the embodiment of the invention. A suitable sigma-delta dither function modulator 80 is disclosed in U.S. Pat. No. 6,044,124 the disclosure of which is incorporated herein by reference.

In an alternative embodiment of the FFS 32, a first integer divider integer divides the reference signal 36 by a plurality of integers (e.g., X2 and X2+1 or a plurality of integers selected by a dither function modulator). The effect of the first integer divider is to divide the reference signal 36 by (I+Fr) to generate a fractionally divided oscillating signal. A second integer divider divides the output oscillating signal 26 by an integer to generate an integer divided oscillating signal. The second phase error is generated as the difference between the fractionally divided oscillating signal and the integer divided oscillating signal.

The FFS 32 serves as an essentially "perfect" (free of static errors) variable oscillator. In addition, the FFS 32 internally has a very wide bandwidth which reduces phase noise generated by the VCO 54 of the FFS 32. With this "perfect" variable oscillator; a higher order PLL is no longer required to correct for static errors. Therefore the outer loop of FIG. 2 can be an uncompensated Type I loop which exhibits monotonic amplitude-frequency rolloff from unity gain at DC, and therefore satisfies the requirement for |G|<=1 which prevents systematic error growth.

Figure 5:
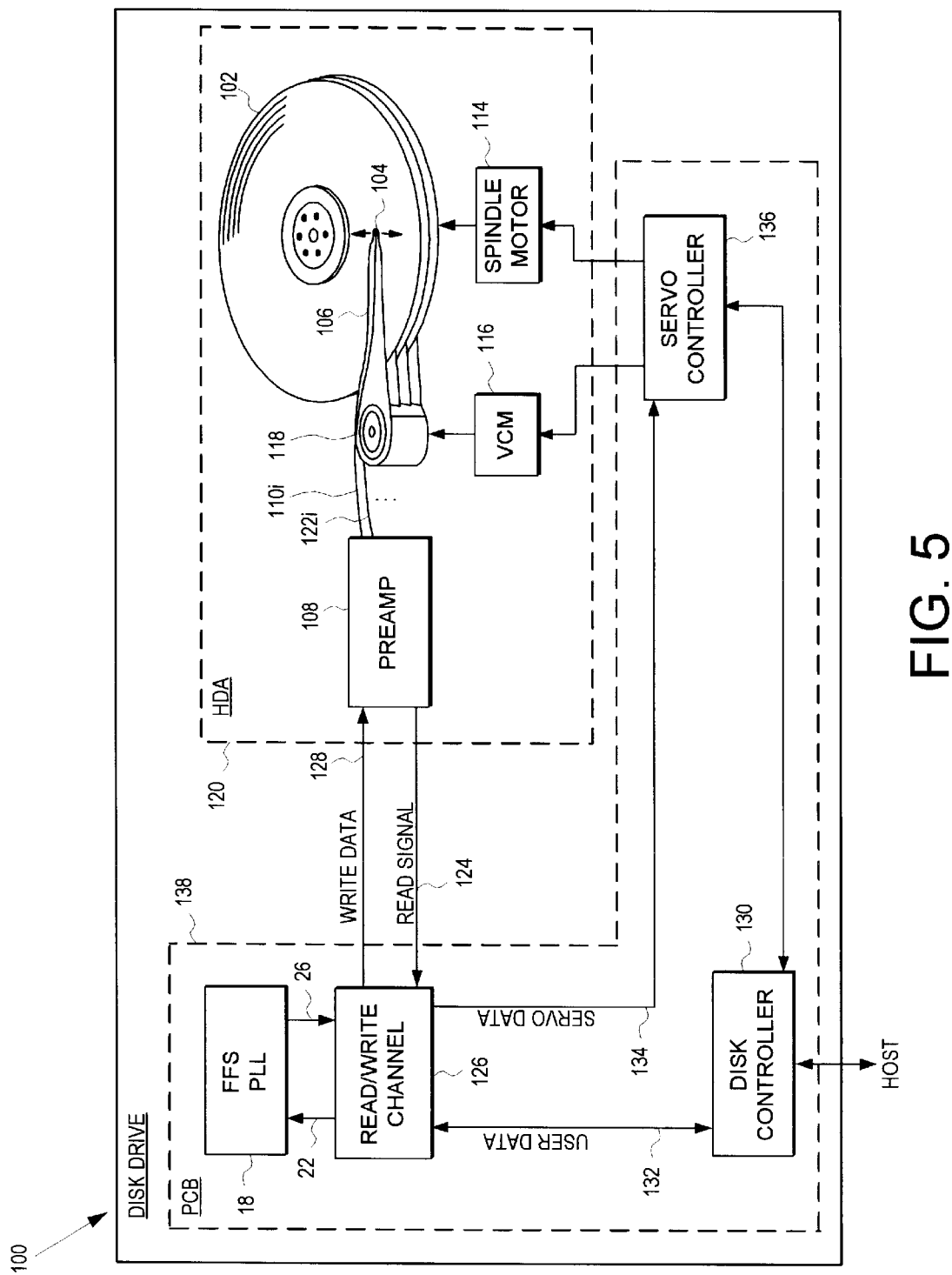
FIG. 5 shows a disk drive for performing a self-servo writing operation by propagating a clock signal across the surface of a disk using an internal FFS PLL according to an embodiment of the present invention.

FIG. 5 shows a self-servo writing disk drive 100 according to an embodiment of the present invention. The disk drive 100 comprises a disk 102 having a plurality of concentric tracks, and a head 104 connected to the distal end of an actuator arm 106. The head 104 for servo-writing a plurality of the tracks by writing embedded servo sectors at a predetermined interval around the circumference of the disk 102. The head also for reading a first write clock from a previously servo-written track, the first write clock for writing embedded servo sectors and a second write clock to a subsequent track. The disk drive 100 further comprises a preamp circuit 108 for generating a write signal 110i applied to the head 104 for writing the embedded servo sectors and the second write clock to the subsequent track. The disk drive 100 comprises the fractional frequency synthesizer (FFS) phase locked loop (PLL) 18 of FIG. 2, wherein the input oscillating signal 22 to the FFS PLL 18 is represented by the first write clock read from the previously servo-written track, and the output oscillating signal 26 is used to write the embedded servo sectors and the second write clock to the subsequent track.

The disk drive 100 of FIG. 5 comprises a spindle motor 114 for rotating the disk 102 and a voice coil motor (VCM) 116 for rotating the actuator arm 106 about a pivot in order to actuate the head 104 radially over the disk 102. The disk 102, head 104, actuator arm 106, preamp circuit 108, spindle motor 114, and VCM 116 are enclosed within a head disk assembly (HDA) 120. In one embodiment, a seed write clock is written on an outer diameter track of the disk 102 before being inserted into the HDA 120. The seed write clock is then propagated from track-to-track during the self servo writing operation.

When reading the first write clock from the previously servo-written track, the head 104 generates a read signal 122i which is amplified by the preamp circuit 108 to generate a read signal 124 applied to a read/write channel 126. The read/write channel 126 comprises suitable circuitry for generating the input oscillating signal 22 to the FFS PLL 18 representing the first write clock read from the disk 102. The FFS PLL 18 frequency/phase locks to the input oscillating signal 22 to generate the output oscillating signal 26. The read/write channel 126 processes the output oscillating signal 26 to write the embedded servo sectors and the second write clock to the subsequent track at the appropriate time.

During normal operation of the disk drive 100, a disk controller 130 communicates with a host computer in order to store and retrieve user data 132. During a write operation, user data 132 received from the host is encoded by the read/write channel 126 (e.g., according to a run-length limit (RLL) code) to generate the write data 128 written to the disk 102 via the preamp circuit 108 and head 104. During a read operation, the head 104 reads the recorded user data to generate the read signal 122i amplified by the preamp circuit 108. The read/write channel 126 processes the read signal 124 from the preamp circuit 108 to demodulate the user data 132 transmitted to the host computer via the disk controller 130. During both read and write operations, the head 104 reads the embedded servo sectors, and corresponding servo data 134 is demodulated by the read/write channel 126. The servo data 134 is processed by a servo controller 136 which generates the appropriate control signals applied to the VCM 116 in order to maintain the head 104 along the centerline of the target track.

In the embodiment of FIG. 5, the FFS PLL 18, read/write channel 126, disk controller 130 and servo controller 136 are implemented in one or more integrated circuits mounted on printed circuit board (PCB) 138. In one embodiment, the FFS PLL 18 is a separate integrated circuit having interface pins for interfacing with a read/write channel 126 integrated circuit. In an alternative embodiment, the FFS PLL 18 is integrated with the read/write channel 126 into a single integrated circuit.

Figure 6:
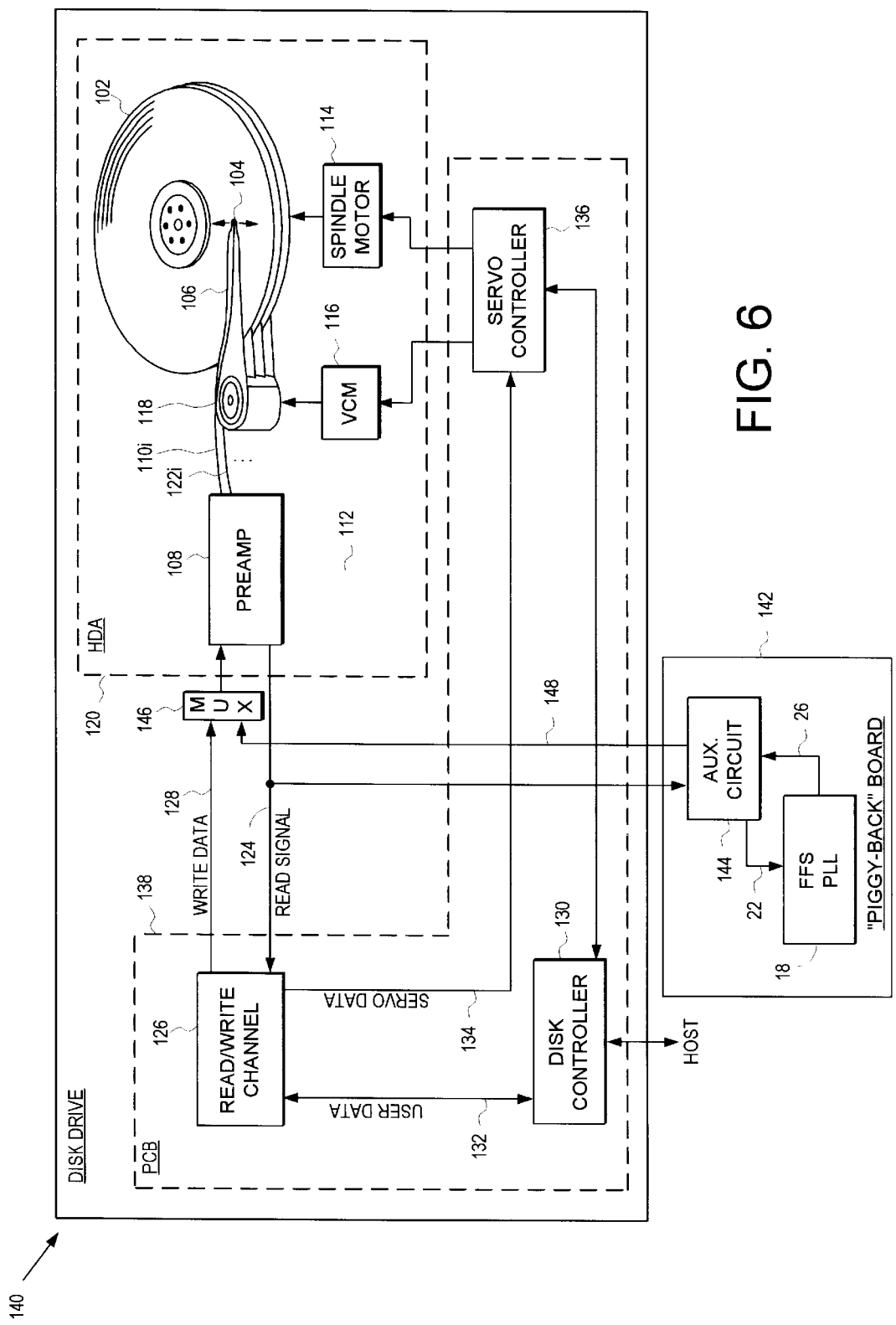
FIG. 6 shows a disk drive for performing a self-servo writing operation by propagating a clock signal across the surface of a disk using an external FFS PLL mounted on a "piggy back" board according to an embodiment of the present invention.

FIG. 6 shows another embodiment of a disk drive 140 wherein the FFS PLL 18 is implemented on a "piggy-back" board 142 which is attached to the disk drive 140 during the self-servo writing operation. The piggy-back board 142 is used to self-servo write multiple disk drives in an assembly line fashion but after enclosing the HDA 120 so that the self-servo writing operation does not require a clean room. In the embodiment of FIG. 6, the piggy-back board 142 comprises an auxiliary circuit 144 for processing the read signal 124 from the preamp circuit 108 in order to generate the input oscillating signal 22 to the FFS PLL 18. The auxiliary circuit 144 also processes the output oscillating signal 26 from the FFS PLL 18 to write the embedded servo sectors and the second write clock to the subsequent track. In the embodiment of FIG. 6, the disk drive 140 comprises a multiplexer 146 for selecting between the write data 128 generated by the read/write channel 126 and the write data 148 generated by the auxiliary circuit 144. During self-servo writing, the multiplexer 146 selects the write data 148 generated by the auxiliary circuit 144 in order to write the embedded servo sectors and the second write clock to the subsequent track. During normal operation, the multiplexer 146 selects the write data 128 generated by the read/write channel 126 in order to write user data to the disk 102.

I claim:

1. A phase locked loop (PLL) circuit comprising:
   (a) an input for receiving an input oscillating signal;
   (b) an output for outputting an output oscillating signal;
   (c) a first phase detector for generating a first phase error between the input oscillating signal and the output oscillating signal; and
   (d) a fractional frequency synthesizer (FFS) for generating the output oscillating signal in response to the first phase error, the FFS comprising an input for receiving a reference oscillating signal, and a fractional divider responsive to variables I and Fr,
   wherein:
   I is an integer value;
   Fr is a fractional value; and
   the variables I and Fr are generated in response to the first phase error.

2. The PLL circuit as recited in claim 1, wherein the FFS further comprises:
   (a) a first integer divider for integer dividing a frequency of the reference oscillating signal by an integer X1 to generate an integer divided oscillating signal;
   (b) a second integer divider for integer dividing a frequency of the output oscillating signal by at least two integers, including integer X2 selected during a first time interval and an integer X3 selected during a second time interval, to effectively divide the output oscillating signal by the value (I+Fr) to generate a fractionally divided oscillating signal;
   (c) a second phase detector for generating a second phase error between the integer divided oscillating signal and the fractionally divided oscillating signal; and
   (d) a variable oscillator, responsive to the second phase error, for generating the output oscillating signal.

3. The PLL circuit as recited in claim 2, wherein the FFS further comprises a loop filter for filtering the second phase error to generate a control signal applied to the variable oscillator.

4. The PLL circuit as recited in claim 2, wherein X3=X2+1.

5. The PLL circuit as recited in claim 4, wherein the FFS further comprises a compensator for attenuating a periodic error in the second phase error to generate a compensated phase error.

6. The PLL circuit as recited in claim 5, wherein the FFS further comprises a loop filter for filtering the compensated phase error to generate a control signal applied to the variable oscillator.

7. The PLL circuit as recited in claim 2, wherein:
   (a) the FFS further comprises a dither function modulator responsive to Fr for generating a switching sequence; and
   (b) the switching sequence selects between at least the X2 and X3 integers as the denominator for the second integer divider.

8. The PLL circuit as recited in claim 7, wherein the dither function modulator comprises a sigma-delta dither function.

9. The PLL circuit as recited in claim 2, wherein the variable oscillator comprises a voltage controlled oscillator.

10. The PLL circuit as recited in claim 1, further comprising an amplifier for amplifying the first phase error by a gain.

11. A method of frequency locking an output oscillating signal to an input oscillating signal, the method comprising the steps of:
   (a) generating a first phase error between the input oscillating signal and the output oscillating signal;
   (b) generating variables I and Fr in response to the first phase error, where I is an integer value and Fr is a fractional value; and
   (c) dividing a frequency of a selected oscillating signal by (I+Fr).

12. The method as recited in claim 11, wherein the selected oscillating signal is the output oscillating signal.

13. The method as recited in claim 12, further comprising the steps of:
   (a) integer dividing a frequency of a reference oscillating signal by an integer X1 to generate an integer divided oscillating signal;
   (b) integer dividing a frequency of the output oscillating signal by at least two integers, including integer X2 selected during a first time interval and an integer X3 selected during a second time interval, to effectively divide the output oscillating signal by the value (I+Fr) to generate a fractionally divided oscillating signal;
   (c) generating a second phase error between the integer divided oscillating signal and the fractionally divided oscillating signal; and
   (d) controlling a variable oscillator in response to the second phase error to generate the output oscillating signal.

14. The method as recited in claim 13, further comprising the step of filtering the second phase error to generate a control signal applied to the variable oscillator.

15. The method as recited in claim 13, wherein X3=X2+1.

16. The method as recited in claim 15, further comprising the step of attenuating a periodic error in the second phase error to generate a compensated phase error.

17. The method as recited in claim 16, further comprising the step of filtering the compensated phase error to generate a control signal applied to the variable oscillator.

18. The method as recited in claim 13, further comprising the steps of:
   (a) generating a switching sequence in response to a dither function; and
   (b) using the switching sequence to select between at least the X2 and X3 integers as the denominator for integer dividing the frequency of the output oscillating signal.

19. The method as recited in claim 18, wherein the dither function comprises a sigma-delta dither function.

20. The method as recited in claim 13, wherein the variable oscillator comprises a voltage controlled oscillator.

21. The method as recited in claim 11, further comprising the step of amplifying the first phase error by a gain.

22. A self-servo writing disk drive comprising:
   (a) a disk comprising a plurality of concentric tracks;
   (b) a head connected to a distal end of an actuator arm, wherein:
      the head for servo-writing a plurality of the tracks by writing embedded servo sectors at a predetermined interval around the circumference of the disk; and
      the head for reading a first write clock from a previously servo-written track, the first write clock for writing the embedded servo sectors and a second write clock to a subsequent track;
   (c) a preamp circuit for generating a write signal applied to the head for writing the embedded servo sectors and the second write clock to the subsequent track; and
   (d) a phase locked loop (PLL) for generating a clock signal for use in writing the embedded servo sectors and the second write clock to the subsequent track, the PLL comprising:
      an input for receiving an input oscillating signal representing the first write clock,
      an output for outputting an output oscillating signal used to generate the clock signal;
      a first phase detector for generating a first phase error between the input oscillating signal and the output oscillating signal; and
      a fractional frequency synthesizer (FFS) for generating the output oscillating signal in response to the first phase error, the FFS comprising an input for receiving a reference oscillating signal, and a fractional divider responsive to variables I and Fr,
      wherein:
         I is an integer;
         Fr is a fractional value; and
         the variables I and Fr are generated in response to the first phase error.

23. The self-servo writing disk drive as recited in claim 22, wherein the FFS further comprises:

(a) a first integer divider for integer dividing a frequency of the reference oscillating signal by an integer X1 to generate an integer divided oscillating signal;

(b) a second integer divider for integer dividing a frequency of the output oscillating signal by at least two integers, including integer X2 selected during a first time interval and an integer X3 selected during a second time interval, to effectively divide the output oscillating signal by the value (I+Fr) to generate a fractionally divided oscillating signal;

(c) a second phase detector for generating a second phase error between the integer divided oscillating signal and the fractionally divided oscillating signal; and (d) a variable oscillator, responsive to the second phase error, for generating the output oscillating signal.

24. The self-servo writing disk drive as recited in claim 23, wherein the FFS further comprises a loop filter for filtering the second phase error to generate a control signal applied to the variable oscillator.

25. The self-servo writing disk drive as recited in claim 23, wherein X3=X2+1.

26. The self-servo writing disk drive as recited in claim 25, wherein the FFS further comprises a compensator for attenuating a periodic error in the second phase error to generate a compensated phase error.

27. The self-servo writing disk drive as recited in claim 26, wherein the FFS further comprises a loop filter for filtering the compensated phase error to generate a control signal applied to the variable oscillator.

28. The self-servo writing disk drive as recited in claim 23, wherein:

(a) the FFS further comprises a dither function modulator responsive to Fr for generating a switching sequence; and (b) the switching sequence selects between at least the X2 and X3 integers as the denominator for the second integer divider.

29. The self-servo writing disk drive as recited in claim 28, wherein the dither function modulator comprises a sigma-delta dither function.

30. The self-servo writing disk drive as recited in claim 23, wherein the variable oscillator comprises a voltage controlled oscillator.

31. The self-servo writing disk drive as recited in claim 22, further comprising an amplifier for amplifying the first phase error by a gain.

* * * * *